(12) United States Patent
Kroesche et al.

(10) Patent No.: US 7,730,346 B2
(45) Date of Patent: Jun. 1, 2010

(54) PARALLEL INSTRUCTION PROCESSING AND OPERAND INTEGRITY VERIFICATION

(75) Inventors: David E. Kroesche, Austin, TX (US); Swamy Punyamurtula, Austin, TX (US)

(73) Assignee: Globalfoundries Inc.

( * ) Notice: Subject to any disclaimer, the term of this patent is extended or adjusted under 35 U.S.C. 154(b) by 480 days.

(21) Appl. No.: 11/742,029

(22) Filed: Apr. 30, 2007

(65) Prior Publication Data

US 2008/0270824 A1    Oct. 30, 2008

(51) Int. Cl.
G06F 11/00    (2006.01)
(52) U.S. Cl. .............................. 714/6; 714/764; 714/766
(58) Field of Classification Search ...................... 714/6, 714/52, 54, 719, 764, 766
See application file for complete search history.

(56) References Cited

U.S. PATENT DOCUMENTS

| | | | | |
|---|---|---|---|---|
| 5,533,035 A * | 7/1996 | Saxena et al. | ............... | 714/761 |
| 6,349,390 B1 * | 2/2002 | Dell et al. | ....................... | 714/6 |
| 6,480,982 B1 * | 11/2002 | Chan et al. | ................... | 714/764 |
| 6,510,528 B1 * | 1/2003 | Freeman et al. | ................ | 714/6 |
| 6,718,444 B1 * | 4/2004 | Hughes | ....................... | 711/155 |
| 7,099,190 B2 * | 8/2006 | Noguchi et al. | ......... | 365/185.09 |
| 7,454,671 B2 * | 11/2008 | Adsitt | ......................... | 714/719 |
| 2004/0088636 A1 * | 5/2004 | Cypher | ....................... | 714/764 |
| 2006/0206769 A1 * | 9/2006 | Klein | ........................... | 714/52 |
| 2007/0300130 A1 * | 12/2007 | Gorobets | ..................... | 714/766 |

* cited by examiner

*Primary Examiner*—Marc Duncan (57) ABSTRACT

A method includes storing a first data to a first portion of a storage location of a storage component of a processing device in association with a first store operation and obtaining a second data from the storage location, the second data being stored at the storage location prior to the first data. The method further includes determining whether the storage location has a bit error at second portion of the storage location different from the first portion based on the second data obtained from the storage location. The method additionally includes storing a third data to a second portion of the storage location in response to determining the storage location has a bit error at the second portion, wherein the third data is to correct the bit error.

18 Claims, 6 Drawing Sheets

PARALLEL INSTRUCTION PROCESSING AND OPERAND INTEGRITY VERIFICATION

FIELD OF THE DISCLOSURE

The present disclosure relates generally to store operations in a processing device and more particularly to error detection for store operations in a processing device.

BACKGROUND

Data stored at a storage component often is susceptible to corruption due to a variety of factors, including static discharge, parasitic capacitance, structural imperfections, and the like. Accordingly, in using a storage component, many conventional processing devices utilize error detection/correction techniques whereby error correcting code (ECC) data is generated for a corresponding storage location (e.g., a cache line) and stored with the corresponding storage location at the storage component. Accordingly, the storage location can be periodically accessed and the integrity of the data stored in the storage location can be verified based on the corresponding ECC data.

The storage of data to a storage location of a storage device during a store operation typically entails the generation of a new ECC value for the storage location. In many instances, data being stored to the storage location may overwrite only a portion of the storage location. However, in the event that an error exists in the remaining portion of the storage location that is not overwritten during a store operation, the new ECC value is calculated using the invalid data and the old ECC value of the storage location is overwritten with the new ECC value, thereby making it impossible to detect the bit error during subsequent accesses to the storage location because the new ECC value was calculated using the erroneous data and thus incorrectly validates the erroneous data. Without the proper precautions, subsequent use of the erroneous data from the storage location can cause errors in calculations or other operations dependent on the data.

To prevent the use of erroneous data, in certain conventional devices the store pipeline is stalled for each store operation until the data previously stored at the corresponding storage location can be verified as valid, or corrected if identified as invalid, before the next store operation can proceed. As a result, the performance of store operations, and thus the performance of the processing device, is negatively impacted. Further, other consumers of the data being stored, such as other processing devices, may be delayed while waiting for the verification of the old data to complete before the new data is available for access. Accordingly, an improved technique for processing store operations for a processing device would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In accordance with one aspect of the present disclosure, a method includes storing a first data to a first portion of a storage location of a storage component of a processing device in association with a first store operation and obtaining a second data from the storage location, the second data being stored at the storage location prior to the first data. The method further includes determining whether the storage location has a bit error at second portion of the storage location different from the first portion based on the second data obtained from the storage location. The method additionally includes storing a third data to a second portion of the storage location in response to determining the storage location has a bit error at the second portion, wherein the third data is to correct the bit error.

In accordance with another aspect of the present disclosure, a method includes performing a first store operation to a first storage location of a storage component and performing a second store operation to a second storage location of the storage component subsequent to performing the first store operation. The method additionally includes determining the first storage location comprises a bit error not overwritten by the first store operation and providing a first entry of an error handling table for the first store operation in response to determining that the first storage location comprises the bit error. The method further includes correcting the bit error at the first storage location based on the first entry of the error handling table.

In accordance with yet another aspect of the present disclosure, a processing device comprising a store pipeline buffer to buffer a sequence of store operations and a storage component to access a first store operation from the store pipeline buffer and to perform the first store operation to a storage location of the storage component. The processing device further includes an error detection unit to determine whether the storage location comprises a bit error not overwritten by the first store operation and an error correction unit to correct the bit error in the storage location in response to the first storage location comprising the bit error.

FIGS. 1-8 illustrate techniques for processing store operations while providing for error detection and correction of storage locations targeted by the store operations. In at least one embodiment, a store pipeline buffer is used to buffer store operations for sequential processing. When storing data associated with a store operation to a storage location, the data previously stored in the storage location is analyzed to determine if there are any errors. In the event that an error is detected in a portion of the previously stored data that was not overwritten by the store operation, the processing of new store operations is stalled and the remaining store operations in the store pipeline are permitted to complete. The storage locations targeted by the subsequent store operations also are analyzed to determine if they had invalid data (i.e., data with a bit error) at the time of the corresponding store operation. An error correction process is invoked to correct those storage locations identified as having invalid data not corrected by being overwritten during a corresponding store operation, whereby the error correction process can include overwriting a portion (e.g., a byte) of the stored data having the bit error with corrected data and overwriting the erroneous ECC data with corrected ECC data.

For ease of discussion, the example techniques are described herein in the context of error detection during store operations to cache entries of a data cache of a processing device. These techniques can also be utilized for error detection during store operations to storage location of other types of storage components, such as store operations to memory locations of system memory or store operations to storage locations of hard disk devices, without departing from the scope of the present disclosure. Further, various embodiments are described in the context of error correcting code (ECC)-based techniques. However, other error detection/correction processes can be utilized without departing from the scope of the present disclosure.

Figure 1:
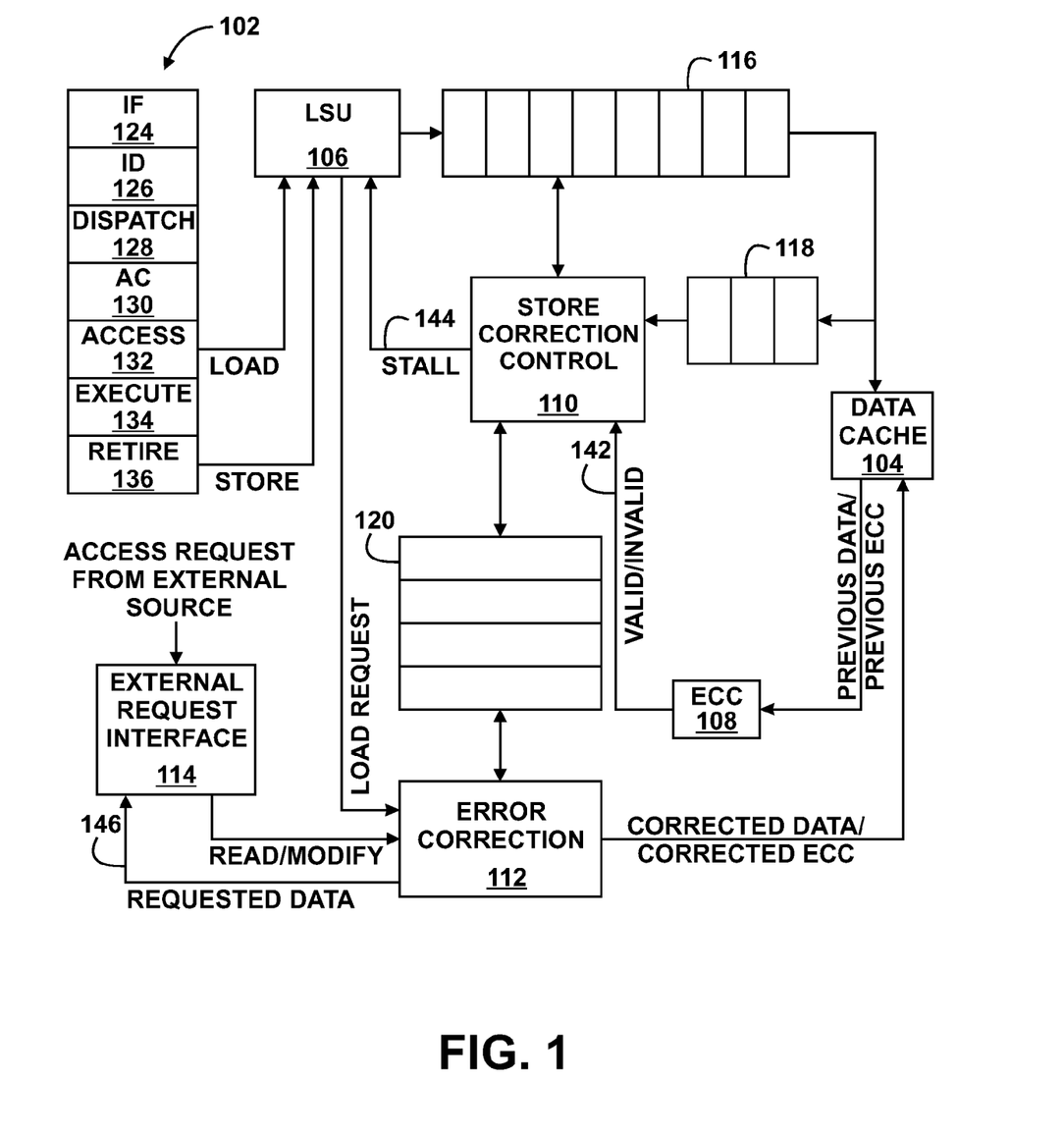
FIG. 1 is a block diagram illustrating an example pipelined processing device in accordance with at least one embodiment of the present disclosure.

FIG. 1 illustrates an example processing device 100 in accordance with at least one embodiment of the present disclosure. The processing device 100 can include, for example, a microprocessor, a microcontroller, an application specific integrated circuit (ASIC), and the like. In the depicted example, the processing device 100 includes an instruction pipeline 102, a data cache 104, a load/store unit (LSU) 106, an ECC unit 108, a store correction control unit 110, an error correction unit 112, an external request interface 114, a store pipeline buffer 116, a post-store buffer 118, and an error handling table 120.

The instruction pipeline 102, in one embodiment, comprises a plurality of processing stages configured to process instructions represented by instruction data fetched from an instruction cache or other storage element (not shown). In the depicted example, the processing stages include an instruction fetch (IF) stage 124, an instruction decode (ID) stage 126, a dispatch stage 128, an address calculation (AC) stage 130, an operand access stage 132, an execute stage 134, and a retire stage 136. Each of the stages 124, 126, 128, 130, 132, 134, and 136 (collectively, "stages 124-126") can include one or more sub-stages. The IF stage 124 is configured to fetch instruction data. The ID stage 126 is configured to decode fetched instruction data to generate corresponding instruction operations. The dispatch stage 128 is configured to dispatch instruction operations based on, for example, functional unit loading and operation dependencies. The AC stage 130 is configured to calculate addresses associated with the decoded instructions, such as, for example, an effective address or a virtual address associated with an operand of a decoded instruction. The operand access stage 132 is configured to initiate the process of loading (fetching) operand data from the data cache 104 or from memory (not shown) and storing operand data to the data cache 104 or to memory for the decoded instructions based on the addresses determined at the AC stage 118. The execute stage 134, in one embodiment, comprises one or more functional units, such as integer units and floating point units, to execute instruction operations using fetched operand data. The retire stage 136 is configured to buffer the results of the operations executed by the functional units of the execute stage 134 until the instruction is ready to be retired. In at least one embodiment, store data resulting from the processing of store operations is written to the data cache 104 via the retire stage 136 (e.g., post-retirement).

The data cache 104 includes a plurality of storage locations, or cache entries (e.g., cache lines), to store data associated with instructions being processed by the instruction pipeline 102. Further, in one embodiment, the data cache 104 includes ECC data for each cache entry. In at least one embodiment, the cache entries of the data cache 104 comprise individually accessible storage locations. To illustrate, the LSU 106 and the data cache 104 may be configured to access, for example, a quad word (sixty-four bits) of data (plus ECC data) from the data cache 104 during any given access, regardless of whether it is only a byte or all sixty-four bits that are intended for use after access from the data cache 104. Further, the LSU 106 and the data cache 104 can be configured so that only a portion of a cache entry is overwritten during a store operation. The data cache 104 can include a set associative cache, a fully associative cache, and the like.

The LSU 106, in one embodiment, manages load and store operations to the data cache 104, as well as memory accesses to memory (not shown). The LSU 106 buffers each store operation as it is received from the retire stage 136. The LSU 106 includes logic to select store operations based on particular selection criteria and to write selected store operations into the store pipeline buffer 116 in the order in which they are selected. The store pipeline buffer 116, in one embodiment, comprises a first-in, first-out pipeline whereby the data cache 104 accesses store operations from the store pipeline buffer 116 in sequence and for each accessed store operation, the data cache 104 performs the corresponding store on a corresponding cache entry of the data cache 104. Further, as each store operation is accessed from the store pipeline buffer 116 for processing by the data cache 104, the store information (or associated data) is temporarily stored in the post-store buffer 118.

Each entry of the store pipeline buffer 116 comprises information utilized by the data cache 104 to carry out the corresponding store operation, such as an address portion that is mapped to a particular cache entry, the data to be stored at the cache entry ("the store data"), the size of data to be stored, the store type (e.g., write back, write through), the memory type, etc.

A store operation to a cache entry of the data cache 104 may result in either a partial overwrite or full overwrite of the data previously stored in the cache entry (hereinafter, "the previous data"). To illustrate, for a thirty-two bit cache entry, a one byte store operation will result in twenty-four bits of the cache entry being unaffected, whereas a four-byte store operation will result in an overwrite of all thirty-two bits of the cache entry. In either case, a change in the data of the cache entry typically entails in the calculation of a new ECC syndrome value for the resulting data value in the cache entry. Accordingly, in one embodiment, the ECC unit 108 is utilized to calculate the new ECC syndrome value, whereby the data cache 104 overwrites the ECC data associated with the previous data (hereinafter, "the previous ECC data") of the cache entry with the newly calculated ECC data.

As a new ECC syndrome typically is calculated based on the entire data value in a cache entry, any error in a bit of the cache entry that is not overwritten during a store operation will propagate to the new data value for the storage location resulting from the store operation and will be encoded into the new ECC syndrome, thereby making it difficult, if not impossible, to subsequently identify the bit error in the storage location. Accordingly, in at least one embodiment, the data cache 104 performs each store operation as a read-under-write access whereby the data previously stored in the cache entry being accessed (hereinafter, "the previous data") is output from the data cache 104, along with the corresponding ECC data (hereinafter, "the previous ECC data"). In another embodiment, a read operation is followed by a write operation to the same cache entry of the data cache 104. In this case, the data read from the cache entry is "the previous data" and the corresponding ECC data is the "previous ECC data." The ECC unit 108, in one embodiment, performs an error detection/correction process on the previous data output from the data cache 104 using the previous ECC data to determine whether the previous data has any errors. In some instances the ECC unit 108 may be configured such that single bit errors can be corrected, whereas multiple bit errors can only be detected but not corrected due to the limitations of the ECC data and the error detection/correction process. In the event that no bit error is detected in the previous data, the ECC unit 108 configures a valid/invalid indicator 142 to a first state (e.g., a logic "1" state) indicating the previous data is valid. Conversely, in the event that a bit error is detected in the previous data, the ECC unit 108 configures the valid/invalid indicator 142 to a second state (e.g., a logic "0" state) indicating the previous data is invalid.

The store correction control unit 110 is configured to manage the processing of store operations and to control a store correction process in the event that an error is identified in a cache entry that has been the target of a store operation. In one embodiment, the store correction control unit 110 monitors the valid/invalid indicator 142. In the event that the valid/invalid indicator 142 is configured to the second state by the ECC unit 108, thereby indicating a store operation has been performed with a cache entry that has a bit error, the store correction control unit 110 configures the processing device 100 into a store correction mode so that detected store errors can be corrected.

At the initiation of the store correction mode, the store correction control unit 110 asserts a stall indicator 144 (e.g., by configuring the stall indicator 144 to a first state (e.g., a logic "1" state). In response to the assertion of the stall indicator 144, the LSU 106 ceases to accept load and store operations from the instruction pipeline 106. Although new store operations are stalled, the store operations already in the store pipeline buffer 116 are permitted to be completed by the data cache 104, thereby clearing out the store pipeline buffer 116.

As the data cache 104 performs the store operations from the store pipeline buffer 116 while in the store correction mode, the store correction control unit 110 provides a corresponding entry in the error handling table 120 for the store operation that wrote to a storage location having the identified error (hereinafter, the "erroneous store operation") and for each store operation subsequent to the erroneous store operation in the store pipeline buffer 116. Information for each store operation can be pulled from the post-store buffer 118 for use by the store correction control unit 110 in initializing the corresponding entry in the error handling buffer 120.

In one embodiment, the store correction control unit 110 initializes an entry of the error handling table 120 for a corresponding store operation by storing an address value representative of the location of the cache entry written to by the store operation. Further, each entry includes valid field (initialized to "1") and a corrected byte field to store a corrected byte that is to be written over the byte position of the corresponding cache entry identified by the address value in the event that the cache entry was identified as having an error at the time of the store operation.

While the processing device 100 is in the store correction mode, the ECC unit 108 is configured to analyze the previous data and previous ECC data output from the data cache 104 during the read-under-write performed for each store operation being cleared from the store pipeline buffer 116. Alternately, the ECC unit 108 is configured to analyze the data obtained from a read operation to the data cache 104 that preceded a write operation to the same cache entry. In the event that the analysis of the previous data and previous ECC data for a store operation indicates that there was a bit error in the corresponding cache entry at the time of the store operation that was not overwritten by the store operation, the ECC unit 108 writes a "0" to the valid field of the entry of the error handling table 120 corresponding to the store operation being analyzed, thereby indicating that an error was detected in the cache entry targeted by the corresponding store operation. Further, for a detected bit error, the ECC unit 108 determines the correct bit using the previous ECC data and generates a byte value having the correct bit in the corresponding bit position (hereinafter, the "corrected byte") and stores the corrected byte to the corresponding entry of the error handling table 120.

In certain instances, a store operation may result in an overwrite of the bit position of the cache entry that has the bit error. As a result, even though the previous data in the cache entry has a bit error, the store operation in effect corrects the bit error. In these instances, the result is there is no error to be corrected, and thus the ECC unit 108 can be configured to determine whether a store operation is directed to the same portion of the cache entry that has the bit error, and if so, refrain from marking the corresponding entry of the error handling table 120 as invalid and further can refrain from determining the corrected byte and corrected ECC value in such instances.

During the store correction mode, the error correction unit 112 steps through the entries of the error handling table 120 and corrects those cache entries of the data cache 104 identified by the error handling table 120 as having a bit error that was not overwritten by a corresponding store operation. In one embodiment, the error correction unit 112 analyzes each entry to determine if its valid field has been set to a predetermined state (e.g., a logic "0" state) indicating that the associated store operation wrote data to a cache entry having a bit error. In the event that the valid field of an entry is set to the predetermined state, the error correction unit 112 accesses the address field, the corrected byte field, and the corrected ECC field of the entry to obtain the address value, the corrected byte, and the corrected ECC value, respectively. The error correction unit 112 then accesses the cache entry of the data cache 104 identified by the address value and writes the corrected byte to the corresponding byte position of the cache entry and overwrites the ECC value of the cache entry with the corrected ECC value. This process results in a correction of the cache entry by correcting the bit error and storing the appropriate ECC syndrome for the corrected data. After the error correction unit 112 has processed all of the entries of the error handling table 120, the error correction unit 112 can signal the store correction control unit 110 to clear or deassert the stall indicator 144, thereby permitting the processing device 100 to exit the store correction mode.

In one embodiment, the error correction unit 112 performs the cache entry correction process in parallel with the generation of entries in the error handling table 120. Thus, once a particular store operation is identified as occurring to a cache entry with a bit error and the corrected byte and corrected ECC value have been stored to the entry of the error handling table 120, the error correction unit 112 can begin the process of correcting the cache entry. However, in certain instances, a sequence of store operations may have two or more store operations to the same cache entry whereby one or more of the store operations may result in an overwrite of the bit error of the cache entry, thereby removing the need to correct the cache entry via the error correction unit 112. Accordingly, in another embodiment, the error correction unit 112 abstains from processing the entries of the error handling table 120 until all of the store operations have been cleared from the store pipeline buffer 116 and their corresponding entries have been generated in the error handling table 120. Thus, after all store operations in the store pipeline buffer 116 have been processed, the error correction unit 112 can snoop the entries of the error handling table 120 to determine whether a subsequent store operation overwrites a bit error in a cache entry targeted by a prior store operation, and if so, the error correction unit 108 can ignore or bypass the entry associated with the prior store operation as the error was corrected when the subsequent store operation was performed by the data cache 104.

Although the LSU 106 can be configured to reject new store operations while in the store correction mode, the instruction pipeline 102 may continue to generate new load operations or the external interface request 114 may continue to receive access requests from other data consumers (e.g., another processing device) for access to a particular cache entry for the purposes of reading, modifying, or victimizing (e.g., evicting) the data stored therein. Certain accesses may be directed to a cache entry targeted by one of the store operations and thus may be in the process of being corrected at the time of the access request. Accordingly, in one embodiment, the LSU 106 and the external request interface 114 can be configured to deny processing of load operations or access requests during the store correction mode. Further, by preventing load operations and other cache accesses from being processed while in the store correction mode, traffic to the data cache 104 can be reduced, thereby providing more access to the data cache 104 for performing the store correction process. However, this default rejection of such operations can impact the efficient processing of the processing device 100 or other data consumers. Accordingly, in another embodiment, the error correction unit 112 is configured to process load operations and access requests using the information of the error handling table 120 during the store correction mode. For load operations, the error correction unit 112 can determine whether the load operation targets a cache entry identified in the error handling table 120 as storing invalid data. If not, the error correction unit 112 can signal the LSU 106 to proceed with the load operation. If, however, the load operation is targeted to a cache entry identified as storing invalid data, the error correction unit 112, in one embodiment, can cancel the load operation. In another embodiment, the error correction unit 112 can dynamically correct the data stored in the targeted cache entry and then return the corrected data to the LSU 106. The data can be corrected using, for example, the corrected byte from the corresponding entry of the error handling table 120 and the remaining bytes from the data cache 104. Likewise, for access requests from other data consumers targeted to a cache entry identified as storing invalid data, the error correction module 112 can either deny the request or dynamically correct and return the requested data.

Figure 2:
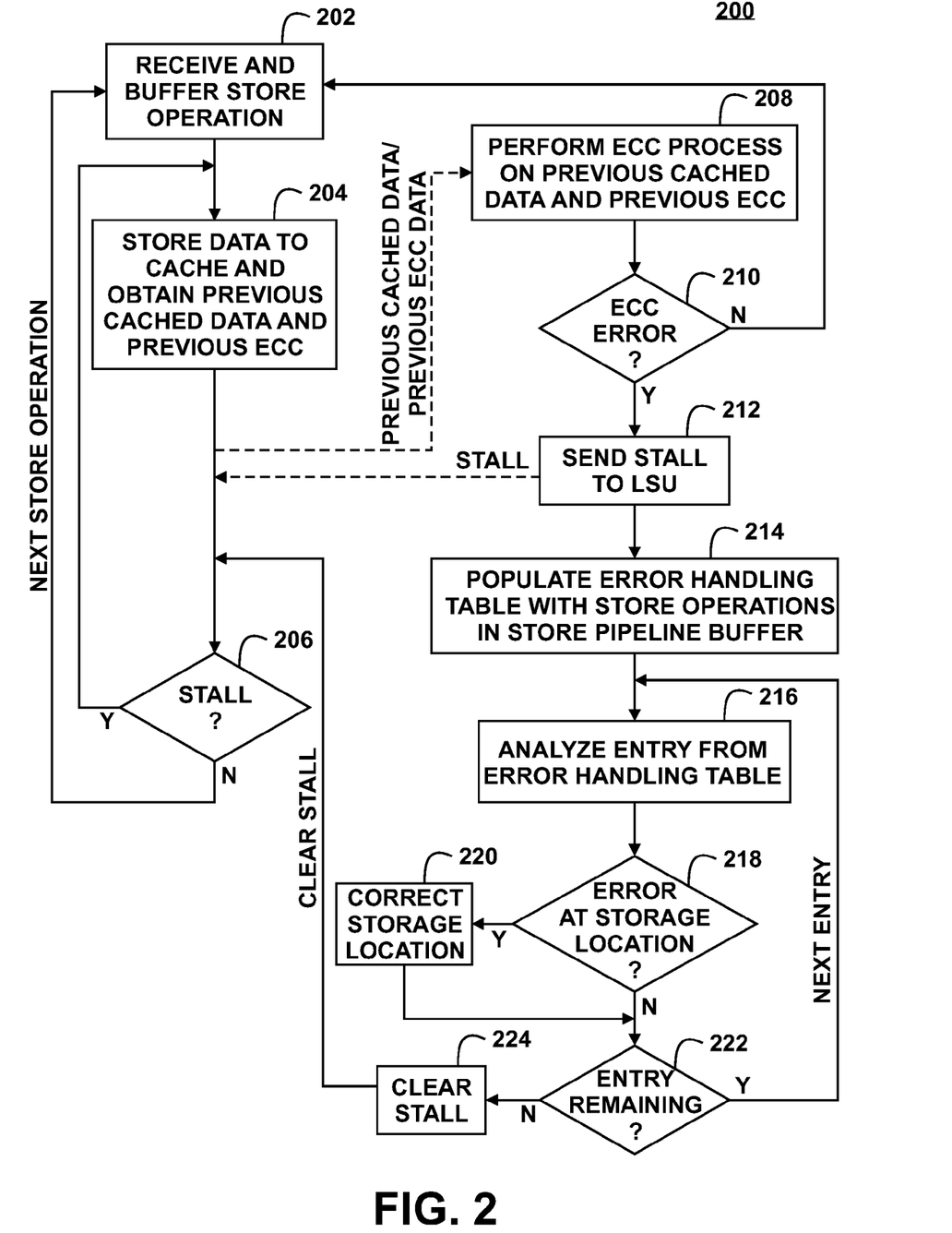
FIG. 2 is a flow diagram illustrating an example method for correcting errors in storage locations of a storage component associated with a sequence of store operations in accordance with at least one embodiment of the present disclosure.

FIG. 2 illustrates an example method 200 of detecting and correcting errors in storage locations targeted by store operations in a processing device in accordance with at least one embodiment of the present disclosure. For ease of illustration, the method 200 is described in the context of the processing device 100 of FIG. 1.

At block 202 a store operation is received at the LSU 106 from the instruction pipeline 102 and buffered in the store pipeline 116. When the store operation arrives at the front of the store pipeline 116, a read-under-write operation is performed for the store operation at block 204 (or, alternately, a read operation followed by a write operation to the same cache entry), whereby the data associated with the store operation is written to the corresponding cache entry of the data cache 104 and the previous data and previous ECC data previously stored at the cache entry are output from the data cache 104. In the event that the stall indicator 144 does not indicate that a stall condition exists (as represented by block 206), the process of blocks 202 and 204 repeats for the next store operation.

At block 208 the ECC unit 108 performs an ECC process using the previous data and previous ECC data output by the data cache 104 to determine whether the cache entry had an error at the time that the store operation was performed. If no bit error is identified at block 210, the process of blocks 202, 204, 206 and 208 continues for the next store operation. Otherwise, if a bit error is detected in the cache entry at the time of the store operation, at block 212 the store correction control unit 110 asserts the stall indicator 144, thereby stalling the processing of any new store operations at blocks 202, 204, and 206. In response to the assertion of the stall indicator 144, the processing device 100 enters the store correction mode. At block 214, the error handling table 120 is populated with an entry for the store operation detected as targeting a cache entry with invalid data as well as an entry for each subsequent store operation as it is processed from the store pipeline buffer 116 by the data cache 104. As each store operation is processed for a targeted cache entry, the ECC unit 108 determines whether the previous data of the targeted cache entry has a bit error using the previous data and previous ECC data of the targeted cache entry. In the event that no bit error is detected, the ECC unit 108 configures the valid field of the corresponding entry to a valid state, thereby indicating no correction is necessary for the store operation. Otherwise, if a bit error is detected, the ECC unit 108 configures the valid field of the corresponding entry to an invalid state, thereby indicating error correction is need. Further, in one embodiment, the ECC unit 108 determines the corrected byte to be stored for the corresponding cache entry, as well as the corrected ECC data for the corrected data, and stores the corrected byte and corrected ECC data to the corresponding entry of the error handling table 120. In another embodiment, the corrected ECC data is calculated and stored at the cache as part of the process of storing the corrected data to the corresponding cache entry. Further, the population of the error handling table 120 at block 214 can include determining whether a subsequent store operation represented in the error handling table 120 overwrites a bit error found in a cache entry targeted by a prior store operation represented in the error handling table, and if so, validating the entry associated with the prior store operation so that unnecessary error correction is not performed due to its de facto correction by the subsequent store operation.

At block 216, the error correction unit 112 accesses an entry of the error handling table 120 to determine if the cache entry targeted by the corresponding store operation is to be corrected. This analysis can include, for example, accessing the valid field of the entry to determine its state, thereby determining whether to proceed with error correction. In the event that the targeted cache entry is identified as needing correction at block 218, the error correction unit 112 accesses the cache entry of the data cache 104 and overwrites the identified byte using the corrected byte from the entry of the error handling table 120 at block 220. Further, the error correction unit 112 overwrites the incorrect ECC data associated with the cache entry with the corrected ECC data. Should no error correction be necessary for the store operation, or when the error correction for the store operation has completed, at block 222 the error correction unit 112 determines whether there is another entry of the error handling table 120 to be processed. If so, the error correction process of blocks 216, 218, 220, and 222 is repeated for the next entry. Otherwise, all store operations have been processed for correction, and thus the error correction unit 112 directs the store correction control unit 110 to clear the stall indicator 144 at block 224, thereby permitting the LSU 106 to begin accepting new store operations at block 202.

Figure 3:
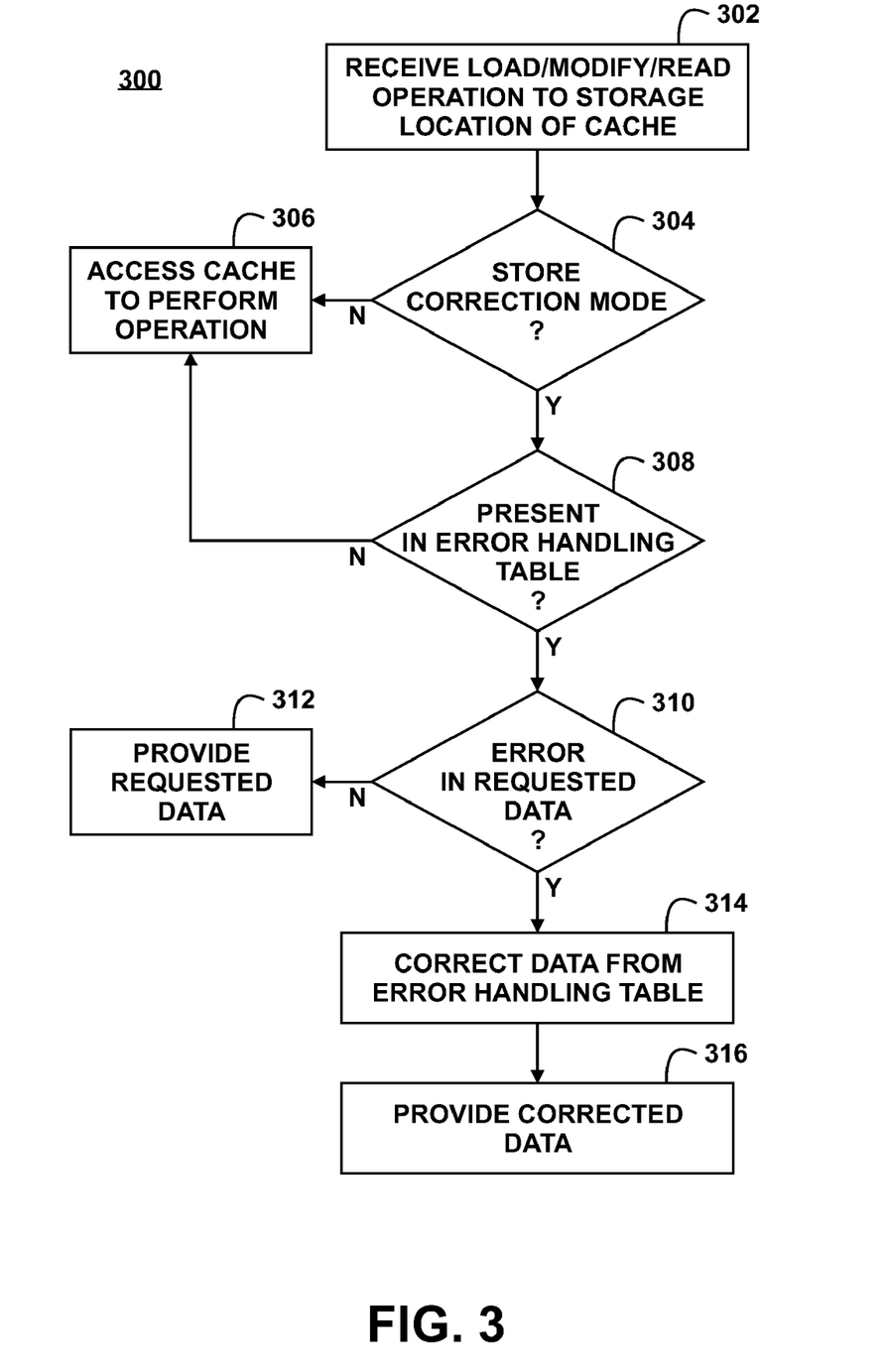
FIG. 3 is a flow diagram illustrating an example method for handling an external request to access a storage location during a stall of a load/store unit for correcting errors in storage locations in accordance with at least one embodiment of the present disclosure.

FIG. 3 illustrates an example method 300 of servicing load operations or external cache access requests while a processing device is in a store correction mode in accordance with at least one embodiment of the present disclosure. For ease of illustration, the method 300 is described in the context of the processing device 100 of FIG. 1.

At block 302, a load operation is received at the LSU 106 or a cache access request is received at the external request interface 114, whereby the cache access request represents a read operation, a modify operation, or a victimize operation for a cache entry of the data cache 104. At block 304, the LSU 106 or the external request interface 114 determines whether the processing device 100 is in a store correction mode (as indicated by, for example, the stall indicator 144 being in an asserted state). If the processing device 100 is not in the store correction mode, at block 306 the LSU 106 performs the load operation or the cache access request is processed by the data cache 104 in accordance with normal operation.

If, however, the processing device 100 is in the store correction mode, the error correction unit 112 snoops the error handling table 120 to determine whether the load access or cache access request target a cache entry targeted by a store operation in the error handling table 120. If not, the load operation or the cache access request can be processed by the data cache 104 in accordance with normal operation at block 306. Otherwise, at block 310 the error correction unit 112 determines whether the targeted cache entry had a bit error at the time of the store operation that was not corrected by the store operation and therefore contains invalid data. If no bit error was detected, at block 312 the error correction unit 112 permits the LSU 106 to access the data cache 104 to obtain the load data for a load operation, or accesses the data cache 104 to obtain the requested data and returns the requested data to the data consumer via the external request interface 114.

If a bit error was identified in the targeted cache entry, at block 314 the error correction unit 112 dynamically corrects the requested data or load data using the corrected byte from the corresponding entry of the error handling table 120 and the remaining bytes from the data cache 104 and at block 316 returns the corrected data to the LSU 106 for a load operation or to the data consumer for a cache access request.

Figure 4:
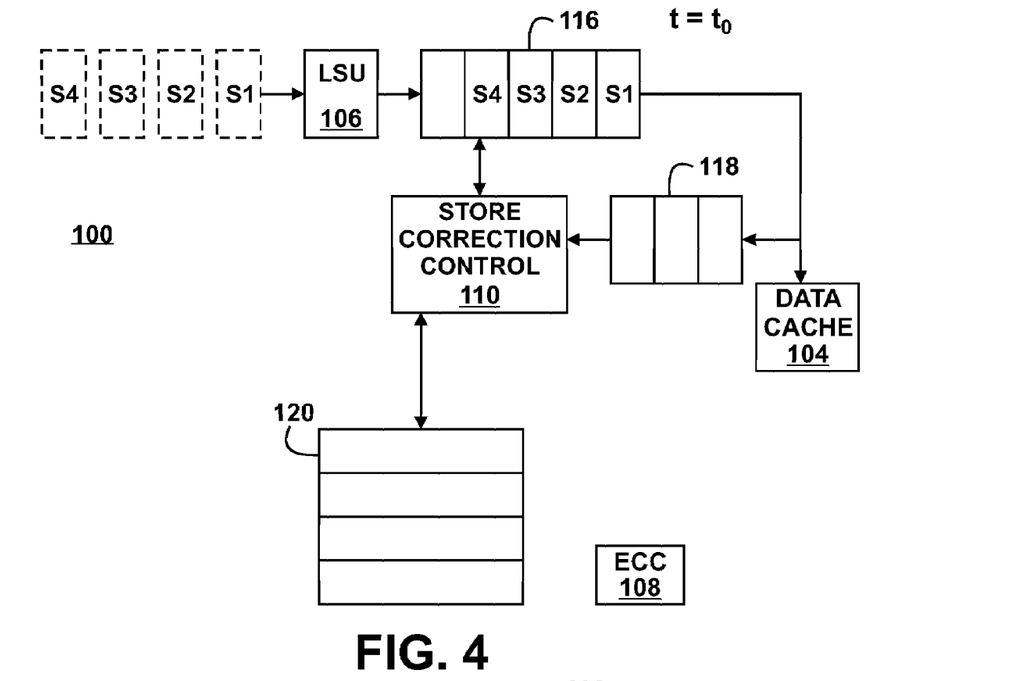
FIGS. 4-8 are diagrams illustrating an example of a stored data correction technique for data associated with store operations in accordance with at least one embodiment of the present disclosure.

FIGS. 4-8 illustrate an example store operation scenario in the context of the store correction technique of FIGS. 1 and 2 in accordance with at least one embodiment of the present disclosure. FIG. 4 illustrates an initial state of the processing device 100 at time $t_0$. In this example, a sequence of store operations S1-S4 have been provided to the LSU 106, whereby the LSU 106 has stored the store operations S1-S4 in the store pipeline buffer 116.

Figure 5:
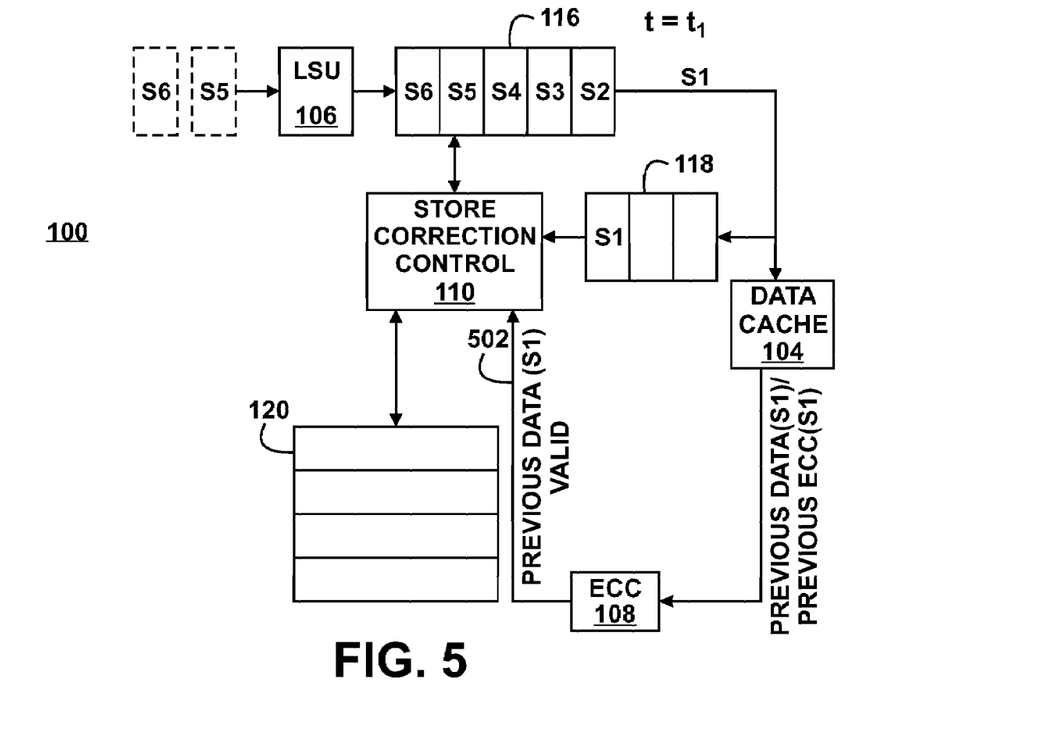

FIG. 5 illustrates a state of the processing device 100 at time $t_1$ whereby the store operation S1 has been processed by the data cache 104 and additional store operations S5 and S6 have been provided to the LSU 106, whereby the LSU 106 has stored the store operations S5 and S6 in the store pipeline buffer 116. Further, information associated with the store operation S1 has been temporarily buffered in the post-store buffer 118. As part of the processing of the store operation S1, the previous data stored at the targeted cache entry and corresponding previous ECC data were output by the data cache 104 and analyzed by the ECC unit 108, whereupon the ECC unit 108 did not detect any bit errors in the targeted cache entry. Accordingly, as illustrated in FIG. 5, the ECC unit 108 provides a valid indicator 502 (corresponding to valid/invalid indicator 142, FIG. 1) indicating that the targeted cache entry stored valid data and thus no correction is necessary.

Figure 6:
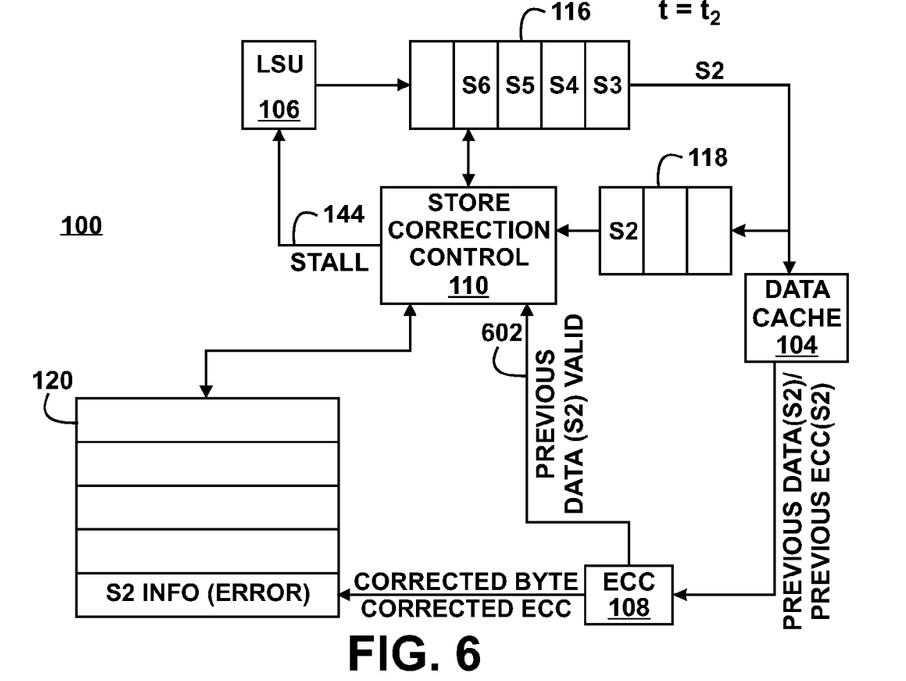

FIG. 6 illustrates a state of the processing device 100 at time $t_2$ whereby the store operation S2 has been processed by the data cache 104. Further, information associated with the store operation S2 has been temporarily buffered in the post-store buffer 118. As part of the processing of the store operation S2, the previous data stored at the targeted cache entry and corresponding previous ECC data were output by the data cache 104 and analyzed by the ECC unit 108, whereupon the ECC unit 108 detected a bit error in the targeted cache entry. Accordingly, as illustrated in FIG. 6, the ECC unit 108 provides an invalid indicator 502 (corresponding to valid/invalid indicator 142, FIG. 1) indicating that the targeted cache entry had a bit error at the time of the store operation S2 and thus correction may be needed. Accordingly, as also illustrated in FIG. 6, the store correction control unit 110 asserted the stall indicator 144 and initialized an entry in the error handling table 120 for the store operation S2. Further, the ECC unit 108 has calculated the corrected byte for the bit error and the corrected ECC syndrome and has stored the corrected byte and corrected ECC syndrome in the initialized entry.

Figure 7:
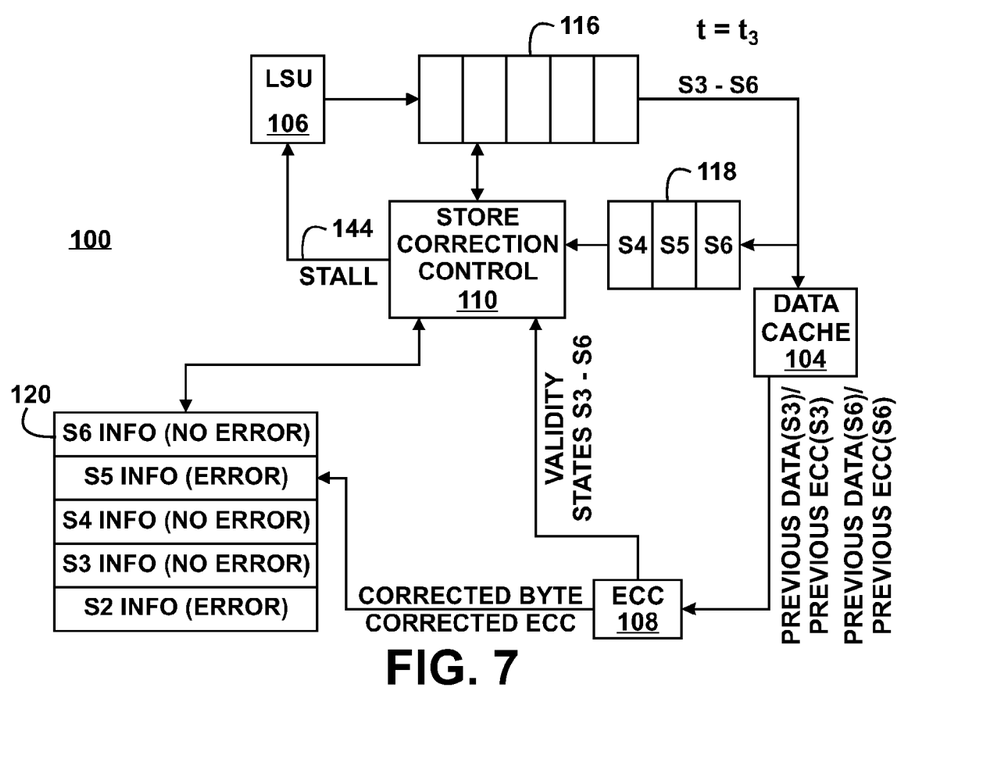

FIG. 7 illustrates a state of the processing device 100 at time $t_3$ whereby the store operations S3-S6 have been processed by the data cache 104. Further, information associated with the store operations S3-S6 has been temporarily buffered in the post-store buffer 118. As part of the processing of each of the store operations S3-S6, the previous data stored at the targeted cache entry and corresponding previous ECC data were output by the data cache 104 and analyzed by the ECC unit 108, whereupon the ECC unit 108 detected a bit error in the targeted cache entry of store operation S5 but did not detect a bit error in the targeted cache entries of store operations S3, S4, or S6. Accordingly, as illustrated in FIG. 7, the ECC unit 108 provides an invalid indicator for the store operation S5 and a valid indicator for each of the store operations S3, S4, and S6. Further, due to the bit error detected in the prior store operation S2, as also illustrated in FIG. 7, the store correction control unit 110 initialized an entry in the error handling table 120 for each of the store operations S3-S6, whereby the entry for store operation S5 identifies the store operation S5 as needing correction and the entries for store operations S3, S4, and S6 indicate that correction is not needed for store operations S3, S4, and S6. Further, the ECC unit 108 has calculated the corrected byte for the bit error and the corrected ECC syndrome for the cache entry targeted by the store operation S5 and has stored the corrected byte and corrected ECC syndrome in the initialized entry of the error handling table for store operation S5.

Figure 8:
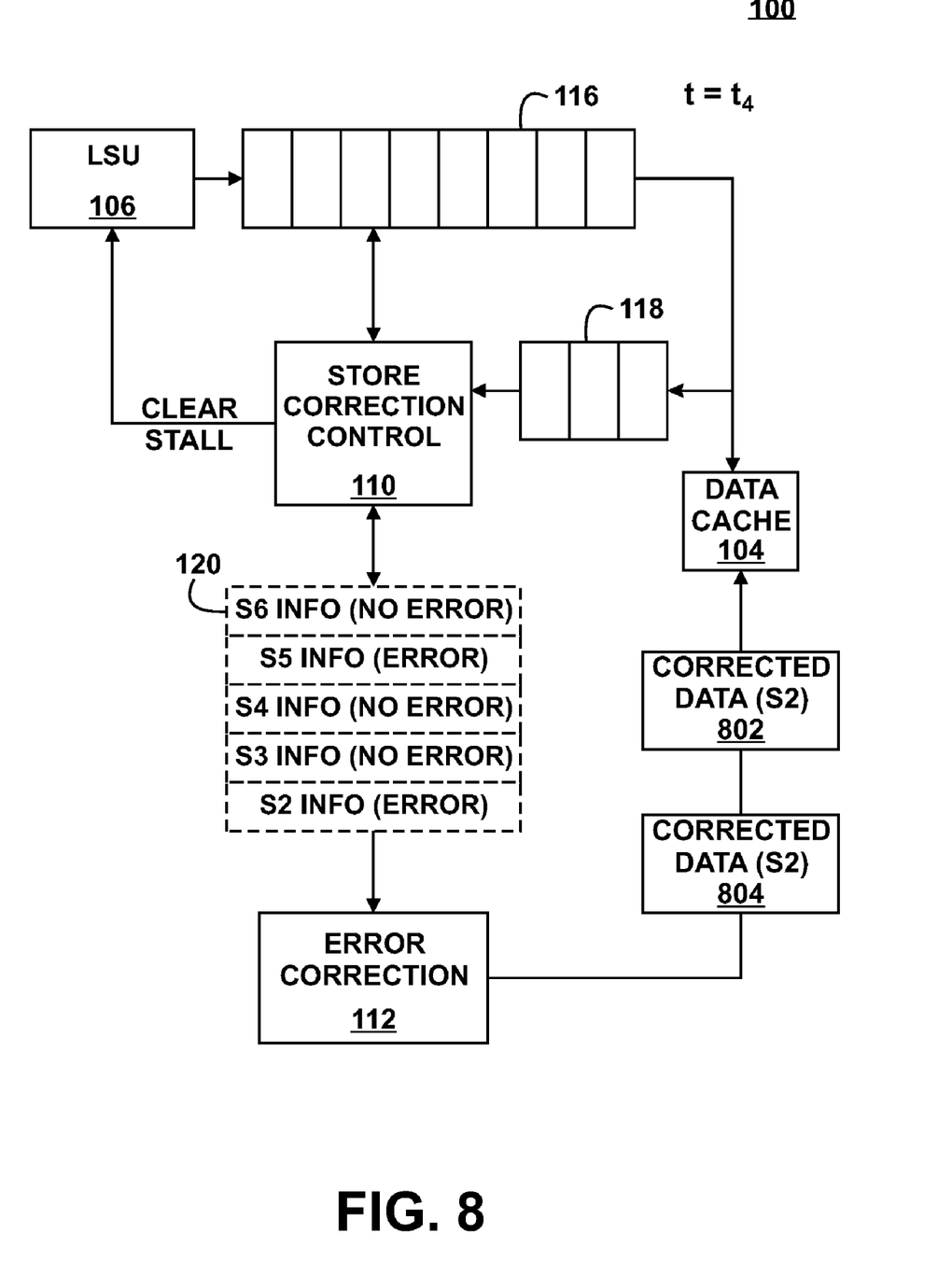

FIG. 8 illustrates a state of the processing device 100 at time $t_4$ whereby the error correction unit 112 has stepped through each entry of the error handling table 120 and made the appropriate corrections to the data cache 104. As illustrated by FIG. 8, the error correction unit 112 identified the cache entry targeted by the store operation S2 as requiring correction, and thus the error correction unit 112 accessed the corrected data and ECC data (corrected data 802) from the entry for store operation S2 and wrote the corrected data 802 to the targeted cache entry of the data cache 104. Likewise, the error correction unit 112 also identified the cache entry targeted by the store operation S5 as requiring correction, and thus the error correction unit 112 accessed the corrected data and ECC data (corrected data 802) from the entry for store operation S5 and wrote the corrected data 804 to the targeted cache entry of the data cache 104. After correcting the store operations S2 and S5, the error correction unit 112 directed the store correction control unit 110 to clear the stall indicator 144, thereby permitting the processing device 100 to exit the store correction mode.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
   storing a first data to a first portion of a storage location of a storage component of a processing device in association with a first store operation, the storage location comprising the first portion and a second portion different than the first portion, the first portion and the second portion to store non-error correcting code data;
   obtaining a second data from the storage location and obtaining first error-correcting code (ECC) data associated with the second data, the second data being stored at the storage location prior to the first data;
   determining whether the storage location has a bit error at the second portion of the storage location based on the second data obtained from the storage location and based on the first ECC data; and
   storing a third data to the second portion of the storage location in response to determining the storage location has a bit error at the second portion, wherein the third data is to correct the bit error.

2. The method of claim 1, wherein obtaining the second data from the storage location comprises obtaining the second data in response to storing the first data.

3. The method of claim 1, further comprising:
   determining a second ECC data based on the third data in response to determining the storage location has a bit error at the second portion; and
   overwriting the first ECC data of the storage component with the second ECC data.

4. The method of claim 1, further comprising:
   determining the third data based on the first data.

5. A method comprising:
   performing a first store operation to a first storage location of a storage component;
   performing a second store operation to a second storage location of the storage component subsequent to performing the first store operation;
   determining the first storage location comprises a bit error not overwritten by the first store operation;
   providing a first entry of an error handling table for the first store operation in response to determining that the first storage location comprises the bit error;
   providing a second entry of the error handling table for the second store operation in response to determining that the first storage location comprises the bit error; and
   correcting the bit error at the first storage location based on the first entry of the error handling table.

6. The method of claim 5, wherein:
   performing the first store operation comprises storing a first data to a first portion of the first storage location; and
   determining the first storage location comprises the bit error comprises:
      obtaining a second data stored at the first storage location prior to storing the first data;
      determining the bit error at the first storage location based on the second data; and
      determining the bit error occurs at a second portion of the first storage location separate from the first portion of the first storage location.

7. The method of claim 5, wherein providing the first entry of the error handling table comprises:
   determining a corrected data based on the bit error; and
   providing the first entry having the corrected data and an indicator of a corresponding portion of the first storage location to be corrected using the corrected data.

8. The method of claim 7, wherein correcting the bit error at the first storage location comprises:
   accessing the corrected data from the first entry of the error handling table; and
   overwriting a portion of the first storage location identified by the indicator with the corrected data.

9. The method of claim 8, further comprising:
   determining a first error correcting code (ECC) data based on the corrected data; and
   overwriting a second ECC data of the storage component associated with the first storage location with the first ECC data.

10. The method of claim 5, further comprising:
   determining the second storage location comprises a bit error not overwritten by the second store operation; and
   correcting the bit error at the second storage location based on the second entry of the error handling table.

11. The method of claim 10, wherein:
   providing the first entry of the error handling table comprises:
      determining a first corrected data based on the bit error of the first storage location; and
      providing the first entry having the first corrected data and a first indicator of a corresponding portion of the first storage location to be corrected using the first corrected data; and
   providing the second entry of the error handling table comprises:
      determining a second corrected data based on the bit error of the second storage location; and
      providing the second entry having the second corrected data and a second indicator of a corresponding portion of the second storage location to be corrected using the second corrected data.

12. The method of claim 11, wherein:
   correcting the bit error at the first storage location comprises:
      accessing the first corrected data from the first entry of the error handling table; and
      overwriting a portion of the first storage location identified by the first indicator with the first corrected data; and
   correcting the bit error at the second storage location comprises:

accessing the second corrected data from the second entry of the error handling table; and overwriting a portion of the second storage location identified by the second indicator with the second corrected data.

13. A processing device comprising:

a store pipeline buffer to buffer a sequence of store operations;

a storage component to access a first store operation from the store pipeline buffer and to perform the first store operation to a storage location of the storage component;

an error detection unit to determine whether the storage location comprises a bit error not overwritten by the first store operation; and an error correction unit to correct the bit error in the storage location in response to the first storage location comprising the bit error.

14. The processing device of claim 13, further comprising:

a load/store unit (LSU) to buffer the sequence of store operations in the store pipeline buffer, the LSU being configured to stall processing of additional store operations in response to the storage location comprising the bit error.

15. The processing device of claim 13, further comprising:

an error handling table comprising a plurality of entries; and a store correction control unit configured to provide an entry of the error handling table for each of the sequence of store operations in response to the first storage location comprising the bit error.

16. The processing device of claim 15, wherein:

the error detection unit is to provide a corrected data based on the bit error for storage at a first entry of the error handling table associated with the first store operation; and the error correction unit is to access the first entry to obtain the corrected data and to overwrite a corresponding portion of the storage location in response to the storage location comprising the bit error.

17. The processing device of claim 15, wherein:

the error correction unit is to:

access the first entry to obtain the corrected data in response to receiving a load operation associated with the storage location; and provide data in response to the load operation based on the corrected data.

18. The processing device of claim 13, wherein:

the error correction unit is to abstain from correcting the bit error based on the first entry in response to determining that the second store operation results in the bit error being overwritten.

* * * * *